United States Patent
Kim et al.

(10) Patent No.: US 7,629,110 B2
(45) Date of Patent: Dec. 8, 2009

(54) MONOMER FOR FORMING ORGANIC ANTI-REFLECTIVE COATING LAYER, POLYMER THEREOF AND COMPOSITION INCLUDING THE SAME

(75) Inventors: Sang-Jeoung Kim, Incheon (KR); Hyo-Jung Roh, Hwaseong-Si (KR); Jong-Kyoung Park, Hwaseong-Si (KR); Jeong-Sik Kim, Hwaseong-Si (KR); Hyun-Jin Kim, Hwaseong-Si (KR); Jae-Hyun Kim, Seoul (KR)

(73) Assignee: Dongjin Semichem Co., Ltd., Incheon (KR)

( * ) Notice: Subject to any disclaimer, the term of this patent is extended or adjusted under 35 U.S.C. 154(b) by 181 days.

(21) Appl. No.: 11/945,895

(22) Filed: Nov. 27, 2007

(65) Prior Publication Data

US 2008/0131815 A1   Jun. 5, 2008

(30) Foreign Application Priority Data

Nov. 29, 2006  (KR) .................. 10-2006-0119257

(51) Int. Cl.
G03F 7/11 (2006.01)
G03F 7/40 (2006.01)
C07F 7/04 (2006.01)
C08G 65/22 (2006.01)

(52) U.S. Cl. .............. 430/313; 430/323; 430/272.1; 556/440; 528/361; 438/952

(58) Field of Classification Search .............. 556/440
See application file for complete search history.

(56) References Cited

U.S. PATENT DOCUMENTS

2005/0033077 A1* 2/2005 Yamahiro et al. .......... 556/450
2006/0068318 A1* 3/2006 Meagley et al. .......... 430/270.1
2006/0134558 A1* 6/2006 Kim et al. .................. 430/311
2006/0199106 A1* 9/2006 Kim et al. .................. 430/311
2006/0199107 A1* 9/2006 Kim et al. .................. 430/311
2006/0199108 A1* 9/2006 Kim et al. .................. 430/311
2007/0135602 A1* 6/2007 Yamahiro et al. .......... 526/242
2008/0213701 A1* 9/2008 Kim et al. .................. 430/314

* cited by examiner

*Primary Examiner*—Cynthia Hamilton
(74) *Attorney, Agent, or Firm*—Birch, Stewart, Kolasch & Birch, LLP

(57) ABSTRACT

A monomer for forming an organic anti-reflective coating layer, a polymer thereof and a composition including the same are disclosed. In a photolithography process, the organic anti-reflective coating layer absorbs an exposed light between a layer to be etched and a photoresist layer, and prevents a photoresist pattern from collapsing due to a standing wave generated under the photoresist layer. The polymer for forming an organic anti-reflective coating layer includes a repeating unit represented by Formula

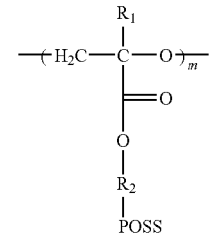

wherein, $R_1$ is a hydrogen atom, a methyl group or an ethyl group, $R_2$ is a $C_1$~$C_{20}$ alkylene group, a $C_3$~$C_{20}$ cycloalkylene group or a $C_6$~$C_{20}$ aromatic hydrocarbon group, POSS is a polyhedral-oligomeric-silsesquioxane, and m is an integer of 2 to 110.

10 Claims, No Drawings

MONOMER FOR FORMING ORGANIC ANTI-REFLECTIVE COATING LAYER, POLYMER THEREOF AND COMPOSITION INCLUDING THE SAME

This application claims the priority benefit of Korean Patent Application No. 10-2006-0119257 filed on Nov. 29, 2006. All disclosure of the Korean Patent application is incorporated herein by reference.

FIELD OF THE INVENTION

This invention relates to a monomer for forming an organic anti-reflective coating layer, a polymer thereof and a composition including the same. In a photolithography process, the organic anti-reflective coating layer absorbs an exposed light between a layer to be etched and a photoresist layer, and prevents a photoresist pattern from collapsing due to a standing wave generated under the photoresist layer.

BACKGROUNDS OF THE INVENTION

In general, a photolithography process includes the steps of: applying a photoresist composition on a substrate such as a wafer, a glass, a ceramic, a metal, or so on by a spin coating, a roller coating, or so on; forming a photoresist layer by heating and drying the applied photoresist composition; forming a photoresist pattern by exposing the photoresist layer to a exposure light of a predetermined pattern, optionally heating, and developing the exposed photoresist layer; and forming a semi-conductor circuit pattern by etching the substrate with the formed photoresist pattern as a mask. The photolithography process is widely used in production of a semi-conductor such as IC (Integrated Circuit), a substrate of a LCD (Liquid Crystal Display) panel, and so on.

Due to an increasing demand for a highly integrated semi-conductor device, KrF excimer laser of a wavelength of 248 nm and ArF excimer laser of a wavelength of 193 nm are used as a light source for the photolithography process. In addition, $F_2$ excimer laser (157 nm), EUV (Extreme UltraViolet), VUV (Vacuum Ultra Violet), E-beam, X-beam, ion beam, etc have been studied and developed as the light source for the lithography process. However, as the wavelength of the exposure light becomes shorter, during the light exposure process, an optical interference of the light reflected at the etching layer of the semi-conductor substrate increases. The interference of the light induces an undercutting, a notching, etc., and deteriorates the photoresist pattern profile and the thickness uniformity of the pattern. To overcome these problems, a bottom anti-reflective coating (BARC) layer is conventionally formed between the etching layer and the photoresist layer to absorb the exposure light. According to the material for forming the anti-reflected coating layer, the anti-reflective coating layer can be classified into an inorganic anti-reflective coating layer made of titanium, titanium dioxide, titanium nitride, chrome oxide, carbon, amorphous silicon, and so on, and an organic anti-reflective coating layer made of a polymer. In comparison with the inorganic layer, the organic anti-reflective coating layer does not generally require complex and expensive apparatus such as a vacuum deposition equipment, a chemical vapor deposition (CVD) device, a sputter device or so on for forming the layer, and has a high absorptivity for a radioactive light, and is generally insoluble in a photoresist solvent. Also, materials of the coating layer do not diffuse from the anti-reflective coating layer into a photoresist layer during coating, heating, and drying the photoresist layer, and the organic anti-reflective coating layer has an excellent etch rate in a dry etch process of a photolithography process. But until now, in the photolithography process using various radiation sources, including ArF excimer laser, the conventional composition for forming the organic anti-reflective coating layer is not satisfactory in its characteristics, such as an absorptivity of an exposure light, an etch rate, an adhesiveness to the substrate, and so on.

SUMMARY OF THE INVENTION

Therefore, it is an object of the present invention to provide a monomer and a polymer for forming an organic anti-reflective coating layer, which has a high absorptivity at the wavelength of ArF excimer laser so that the standing wave, the notching and the undercutting can be prevented to produce a uniform pattern profile, and has an improved etch rate and a good adhesion property to a substrate.

It is another object of the present invention to provide a composition for forming an organic anti-reflective coating layer, which has a high absorptivity for a light reflected from an etching layer, has a low loss of thickness due to a photoresist solvent, an excellent etch rate in a dry etch process, a good contraction stability during a photo cross-linkage and a good coating uniformity, in a photolithography process using various radiation sources including ArF excimer lasers as an exposure light source.

It is still another object of the present invention to provide a method for forming a semi-conductor circuit pattern by using the composition for forming an organic anti-reflective coating layer.

To accomplish these objects, the present invention provides a monomer for forming an organic anti-reflective coating layer, represented by the following Formula 1.

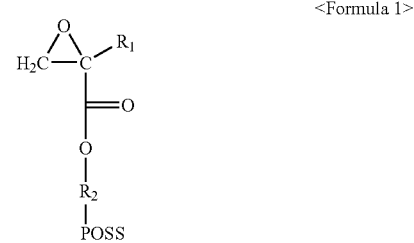

<Formula 1>

In Formula 1, $R_1$ is a hydrogen atom, a methyl group or an ethyl group. $R_2$ is a $C_1$~$C_{20}$ alkylene group, a $C_3$~$C_{20}$ cycloalkylene group or a $C_6$~$C_{20}$ aromatic hydrocarbon group. POSS is a polyhedral-oligomeric-silsesquioxane.

In addition, the present invention provides a polymer for forming an organic anti-reflective coating layer, including a repeating unit represented by the following Formula 2.

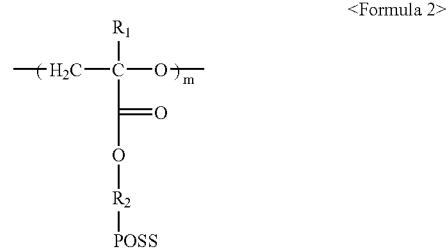

<Formula 2>

In Formula 2, $R_1$, $R_2$ and POSS are as defined in Formula 1, and m is an integer of 2 to 110.

The present invention further provides a composition for forming an organic anti-reflective coating layer, including a polymer containing the repeating unit represented by Formula 2, a light absorber and a solvent, and also provides a method for forming a photoresist pattern by using the above-mentioned composition.

DETAILED DESCRIPTION OF THE INVENTION

A more complete appreciation of the invention, and many of the attendant advantages thereof, will be better appreciated by reference to the following detailed description.

The monomer for forming an organic anti-reflective coating layer according to the present invention is represented by the following Formula 1.

<Formula 1>

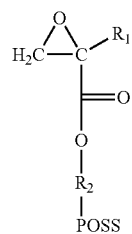

In Formula 1, $R_1$ is a hydrogen atom, a methyl group or an ethyl group. $R_2$ is a $C_1$~$C_{20}$ alkylene group, a $C_3$~$C_{20}$ cycloalkylene group or a $C_6$~$C_{20}$ aromatic hydrocarbon group. POSS is a polyhedral-oligomeric-silsesquioxane. The $C_1$~$C_{20}$ (Carbon atom numbers of from 1 to 20) alkylene group may be represented by

and examples thereof include methylene, ethylene, propylene, butylene, pentylene, hexylene, heptylene, octylene, nonylene, decylene, undecylene, dodecylene, etc. Examples of the $C_3$~$C_{20}$ cycloalkylene group include

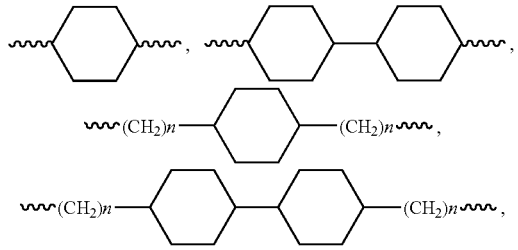

etc. Examples of the $C_6$~$C_{20}$ aromatic hydrocarbon group include

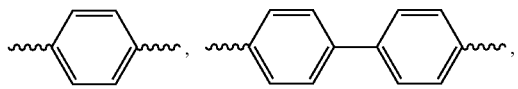

-continued

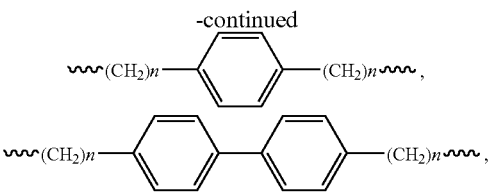

etc. Wherein, the symbol ⌇ indicates a connecting bond, n is an integer which satisfies the total number of carbon atoms of the alkylene group, the cycloalkylene group or the aromatic hydrocarbon group. For example, n is an integer selected from 1 to 20. In addition, the POSS is a three-dimensional molecular structure containing siloxane chains composed of Si/O groups and a structural formula thereof is

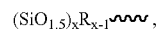

wherein x is 8, 10 or 12, R is H, OH, or a $C_1$~$C_{20}$ alkyl group, alkene group, alkyne group, aryl group or alkoxyl group, and the symbol ⌇ indicates a connecting bond. Specific examples of the POSS include

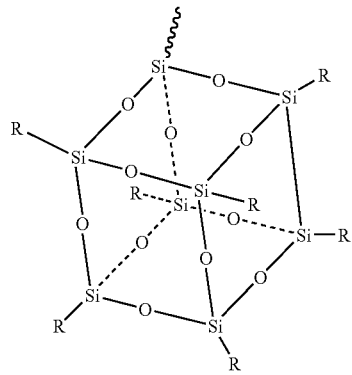

in which x is 8. That is, an exemplary monomer represented by Formula 1 according to an embodiment of the present invention is

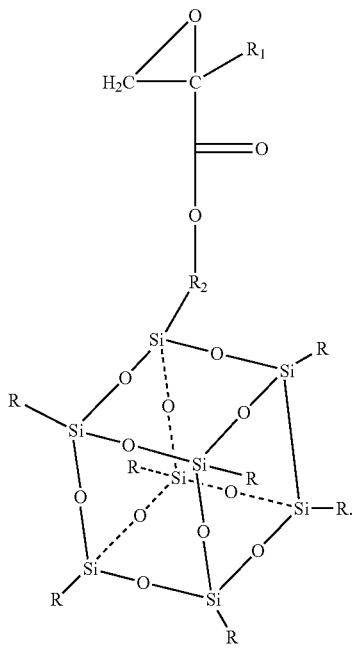

Preferable examples of the monomer represented by Formula 1 include monomers represented by Formula 1a to Formula 1i.
<Formula 1a>
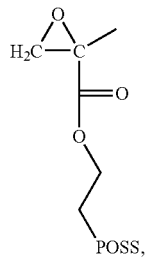
<Formula 1b>
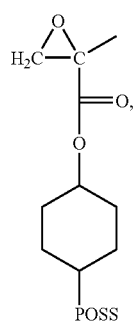
<Formula 1c>
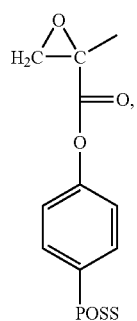
<Formula 1d>
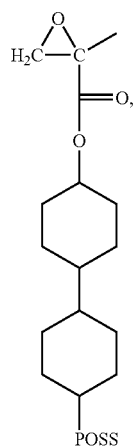
<Formula 1e>
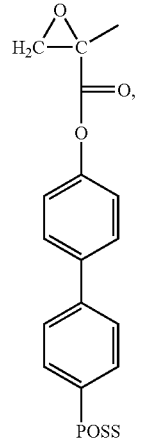
<Formula 1f>
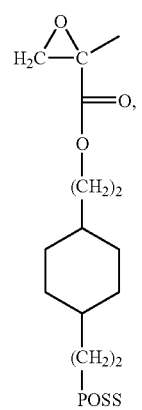
<Formula 1g>
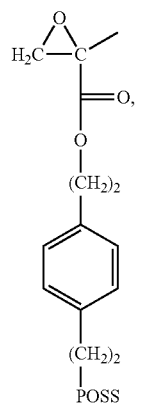

<Formula 1h>

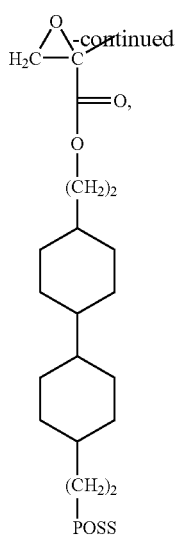

<Formula 1i>

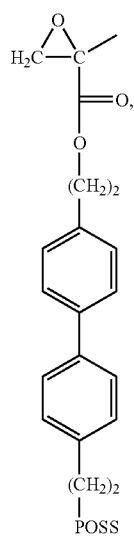

The polymer for forming an organic anti-reflective coating layer according to the present invention includes a repeating unit represented by the following Formula 2.

<Formula 2>

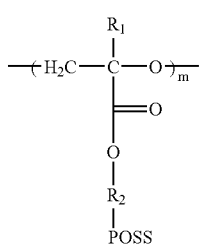

In Formula 2, $R_1$, $R_2$, and POSS are as defined in Formula 1, and m is an integer of 2 to 110, preferably an integer of 2 to 25.

Exemplary polymer according to an embodiment of the present invention, represented by Formula 2 includes

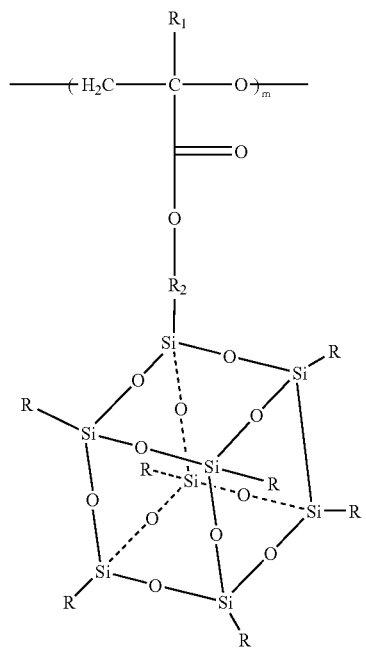

wherein R, $R_1$ and $R_2$ are as defined in Formula 1, and m is an integer of 2 to 110.

Preferable examples of the polymer represented by Formula 2 include polymers represented by Formula 2a to Formula 2i, wherein m is an integer of 2 to 110.

<Formula 2a>

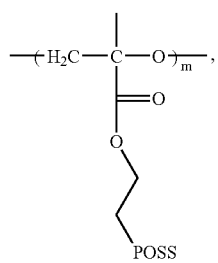

<Formula 2b>

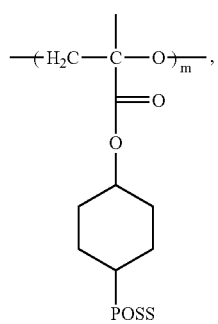

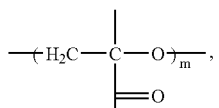
<Formula 2c>
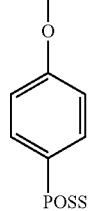
<Formula 2d>
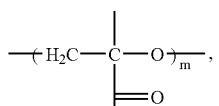
<Formula 2e>
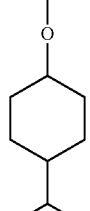
<Formula 2f>
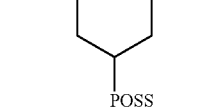
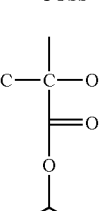
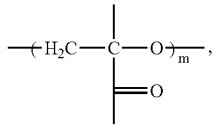
<Formula 2g>
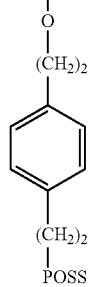
<Formula 2h>
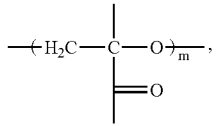
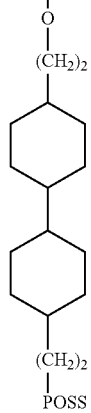
<Formula 2i>
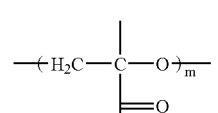
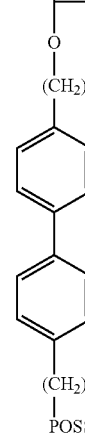

Preferable examples of the organic polymer of the present invention include co- or ter-polymers represented by Formula 3 and Formula 4.

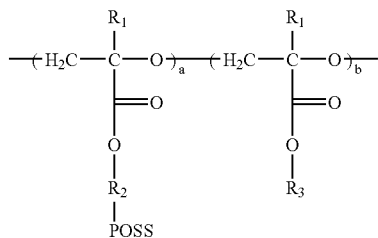
<Formula 3>

In Formula 3, $R_1$, $R_2$ and POSS are as defined in Formula 2, $R_3$ is a $C_2$~$C_{20}$ hydroxy hydrocarbon group (R—OH, R: a $C_2$-$C_{20}$ hydrocarbon group) or a $C_2$~$C_{20}$ alkyl oxirane group, and a and b represent mol % of the respective repeating unit with respective to the total repeating units constituting the polymer, and are 1~90 mol % and 1~90 mol %, respectively. The polymer may be a block copolymer or a random copolymer.

Preferable examples of the copolymer represented by Formula 3 include polymers represented by the following Formula 3a to Formula 3c, wherein a and b are as defined in Formula 3.

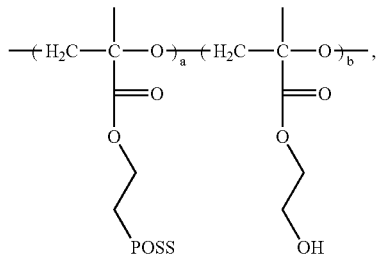
<Formula 3a>

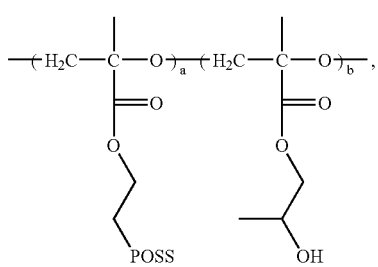
<Formula 3b>

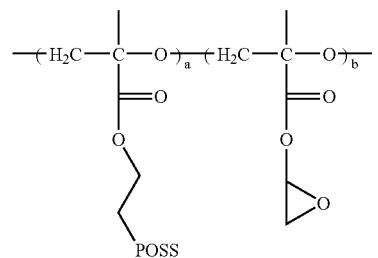
<Formula 3c>

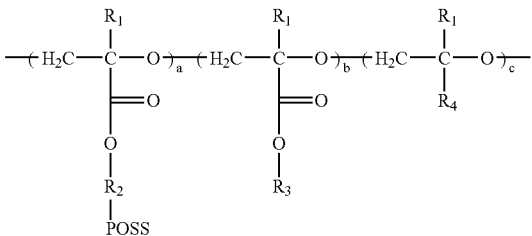
<Formula 4>

In Formula 4, $R_1$, $R_2$, POSS and $R_3$ are as defined in Formula 3. $R_4$ is a group containing a nitrogen atom, preferably a substituted ammonia group, a N-substituted heterocyclic compound group or a N and O-substituted heterocyclic compound group. a, b and c represent mol % of the respective repeating unit with respect to the total repeating units constituting the polymer, and are 1~90 mol %, 1~90 mol % and 1~90 mol %, respectively. The polymer may be a block terpolymer or a random terpolymer.

Preferable examples of the terpolymer represented by Formula 4 include polymers represented by the following Formula 4a to Formula 4f, wherein a, b and c are as defined in Formula 4.

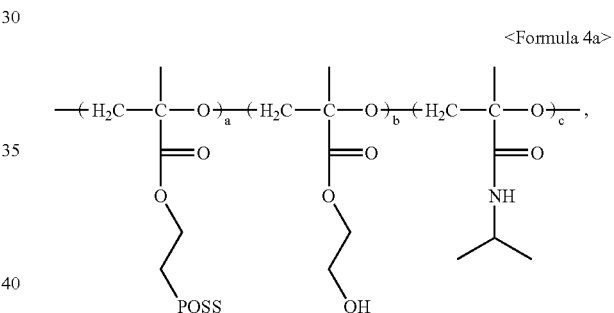
<Formula 4a>

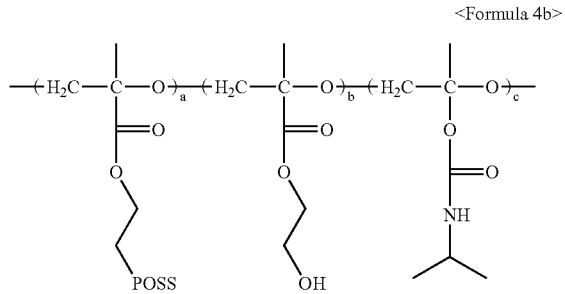
<Formula 4b>

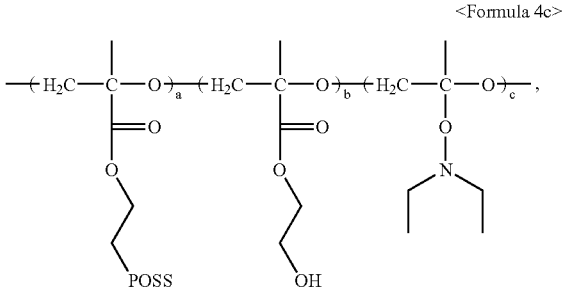
<Formula 4c>

-continued

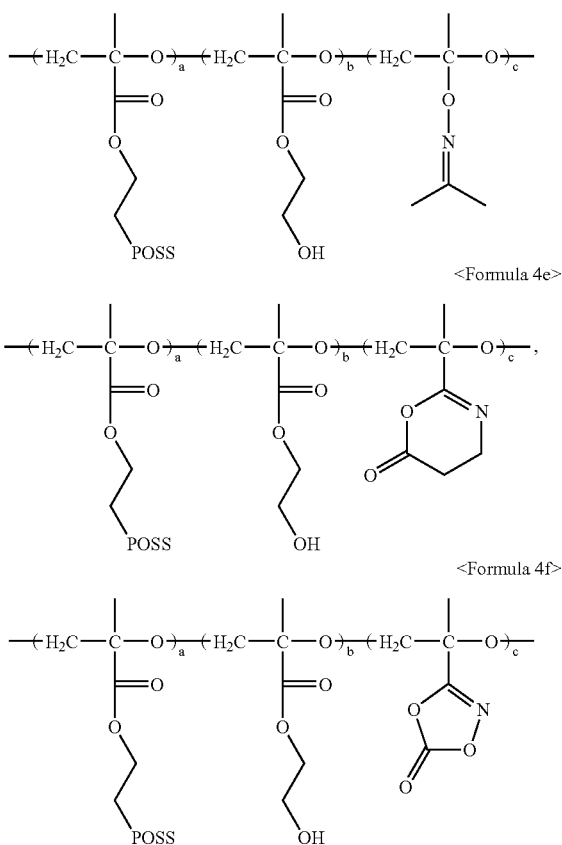

<Formula 4d>

<Formula 4e>

<Formula 4f>

The polymer of the present invention works as a base resin of the organic anti-reflective coating layer, and has ethylene oxide groups at the main chain thereof. The polymer of the present invention is a bottom anti reflecting coating (BARC) polymer having an improved etch rate. The POSS group introduced at the side chain of the BARC polymer increases an electron density in the polymer, which results in the high refractive Index (n value) of the polymer. Further, the hydroxy group (—OH) or the oxirane group (or epoxy group) introduced at the side chain of the polymer increases a cross linking density of the polymer during a curing process, which results in the high refractive Index of the polymer. In addition, the hetero atom (N) introduced at the side chain of the polymer also increases the refractive index. Thus, in the present invention, the thickness of the organic anti-reflective coating layer can be reduced.

The weight-average molecular weight (Mw) of the organic polymer is preferably 1,000 to 100,000, more preferably 5,000 to 50,000. If the molecular weight is less than 1,000, the organic anti-reflective coating layer can be dissolved by a photoresist solvent. If the molecular weight is more than 100,000, a solubility of the polymer to a solvent might decrease, and the etch rate of the organic anti-reflective coating layer in a dry etch process might decrease.

The polymer including the repeating units represented by Formula 2, 3 or 4 can be produced by the following procedure. For example, at least one monomer including the monomer represented by Formula 1 is dissolved with a solvent of dichloromethane, and a polymerization catalyst, such as boron trifluoride diethyl ether etc, is added to the solution. Thereafter, the polymerization reaction is carried out at room temperature.

After the completion of the reaction, the reaction product is precipitated in water and the precipitate is filtered and dried. Then, ammonia and methanol are added thereto and reacted to produce the organic polymer (이 단계는 실시예에 없는것으로 보아, 삭제하여야 할 것으로 보이니, 것으로 보고, 바랍니다.). The monomer which can be polymerized together with the monomer represented by Formula 1 includes conventional monomers for producing the polymer for forming the organic anti-reflective coating layer, and it is preferable to use the monomer represented by Formula 5 and/or Formula 6.

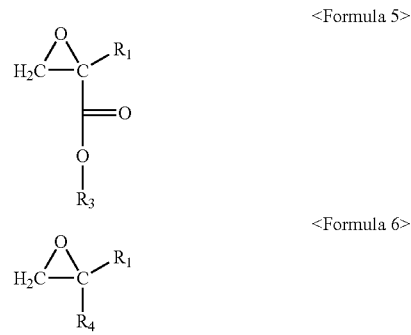

<Formula 5>

<Formula 6>

In Formula 5 and 6, $R_1$, $R_3$ and $R_4$ are as defined in Formula 4.

Preferable examples of the monomer represented by Formula 5 include monomers represented by the following Formula 5a to Formula 5c.

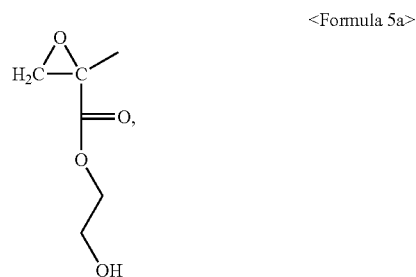

<Formula 5a>

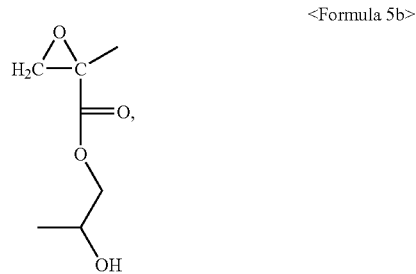

<Formula 5b>

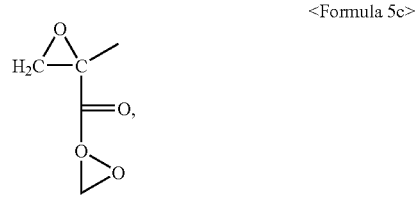

<Formula 5c>

Further, preferable examples of the monomer represented by Formula 6 include monomers represented by the following Formula 6a to Formula 6f

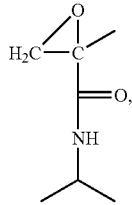
<Formula 6a>

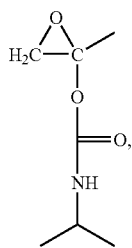
<Formula 6b>

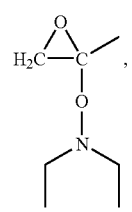
<Formula 6c>

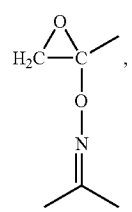
<Formula 6d>

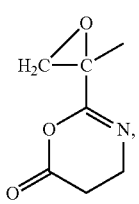
<Formula 6e>

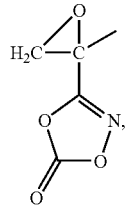
<Formula 6f>

The composition for forming an organic anti-reflective coating layer according to the present invention includes an organic polymer containing a repeating unit represented by Formula 2, a light absorber and a solvent. The amount of the organic polymer in the composition may be varied according to the molecular weight of the polymer, the desired thickness of the organic anti-reflective coating layer, and so on, and is preferably 0.1 to 30 weight % with respect to the total amount of the composition for forming the organic anti-reflective coating layer. If the amount is less than 0.1 weight %, the adhesion property of the organic anti-reflective coating layer might decrease. If the amount is more than 30 weight %, the solubility of polymer to its solvent might decrease.

The light absorber is to absorb a light reflected from an etching layer in a photolithography process, and thereby to prevent the problems such as a undercutting, a notching which may occur in a photoresist pattern. As the light absorber for the present invention, various conventional light absorbers can be used. The representative example of the light absorber can be represented by the following Formula 7, which is disclosed in Korean Patent Application No. 2002-0030405, the content of which is included in this specification for reference.

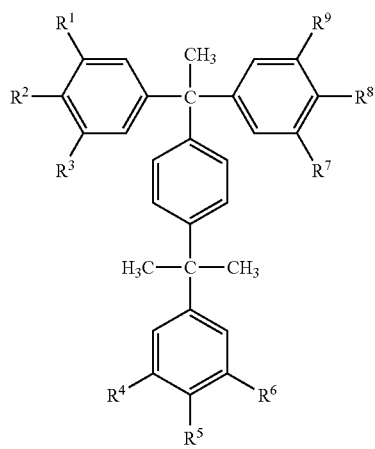
<Formula 7>

In Formula 7, $R^1$ to $R^9$ are independently a hydrogen atom, a hydroxy group, a halogen atom, a nitro group, an amino group, a $C_1$~$C_8$ alkyl group with or without a hydroxy group, a $C_1$~$C_8$ alkoxy group with or without a carbonyl group, a phenyl group, a $C_5$~$C_{10}$ cycloalkyl group, a $C_5$~$C_{10}$ aryl-alkyl group, or a $C_5$~$C_{10}$ alkyl-aryl group, and at least one of $R^1$ to $R^9$ is not a hydrogen atom. The preferable examples of light absorber include

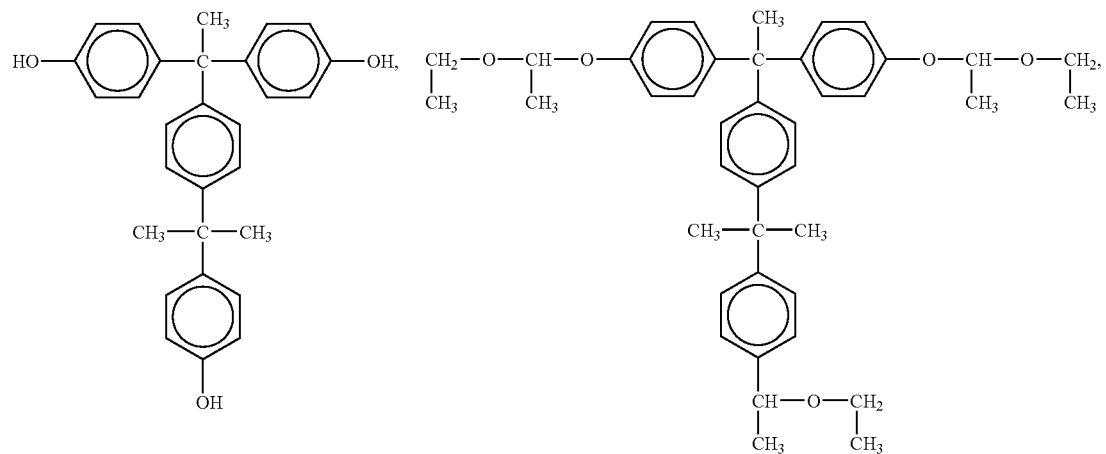
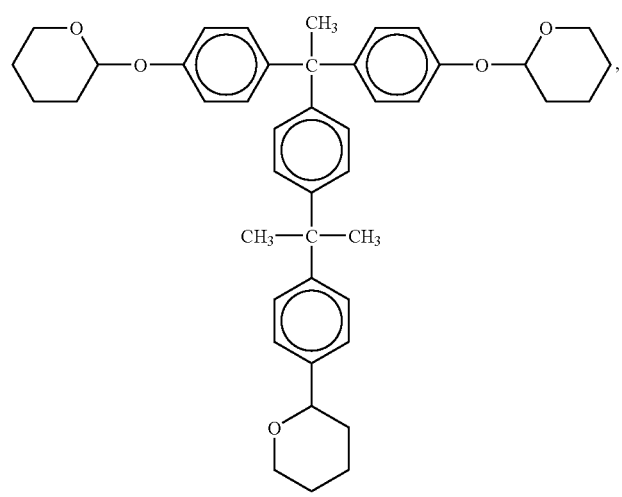
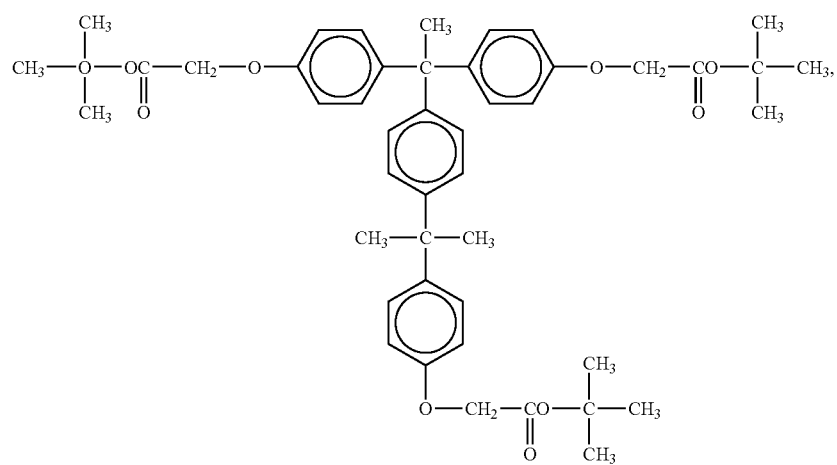

-continued
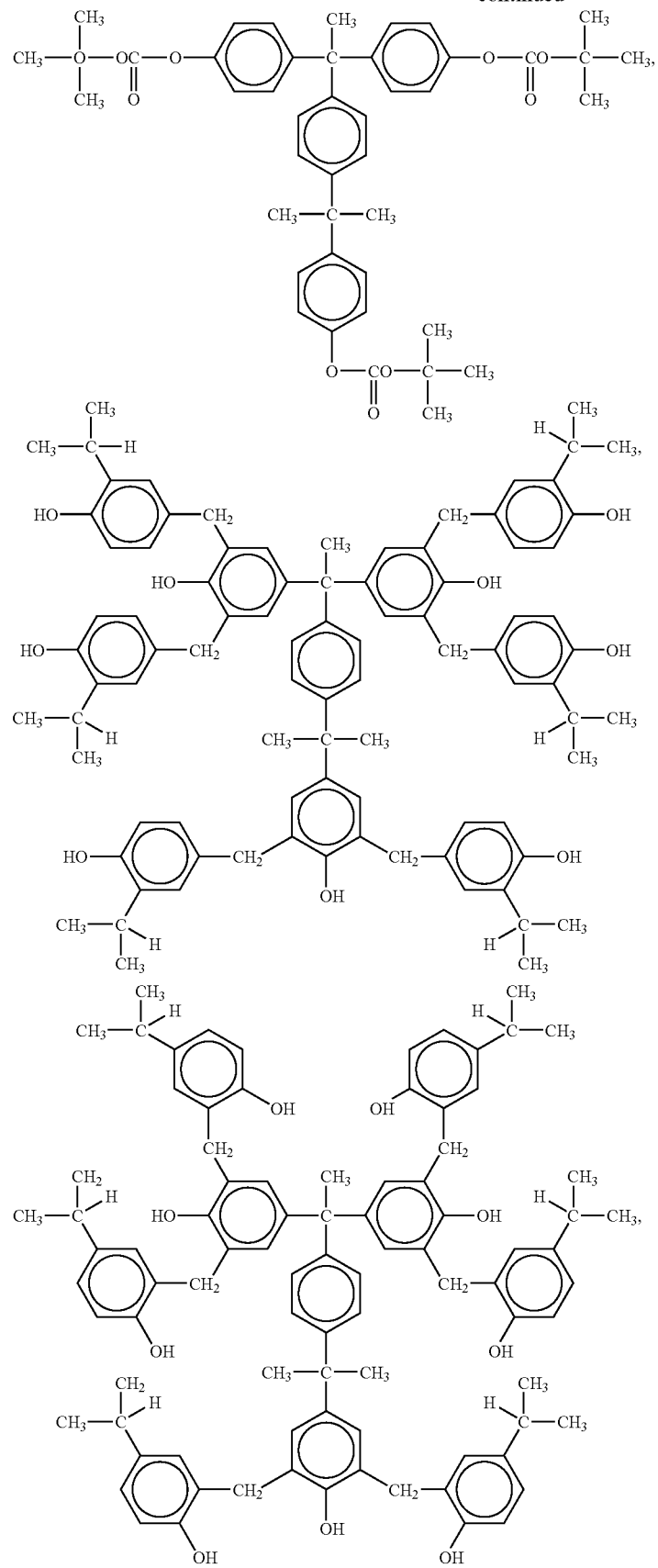

-continued
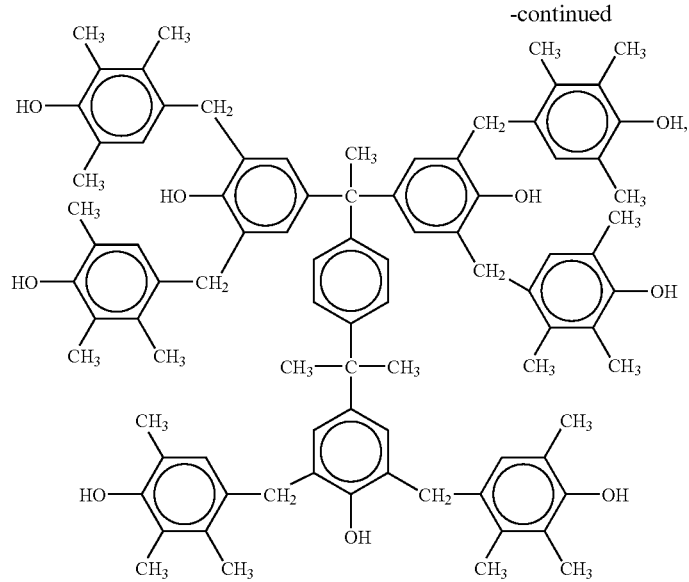
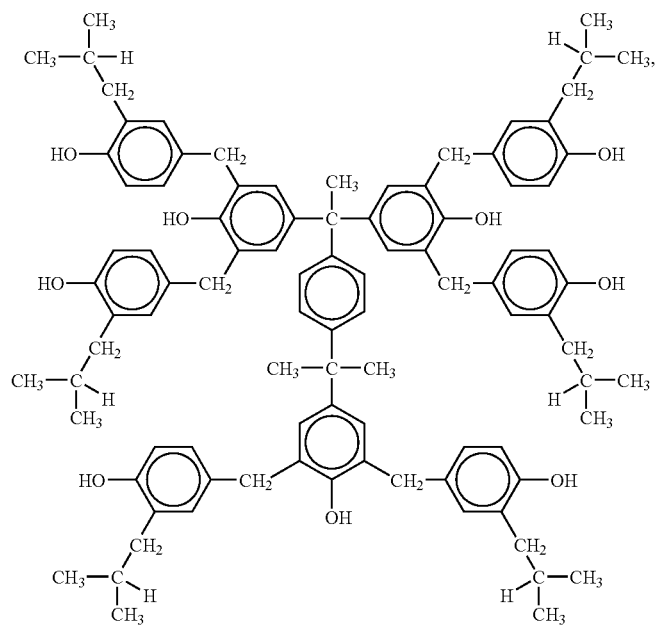

-continued
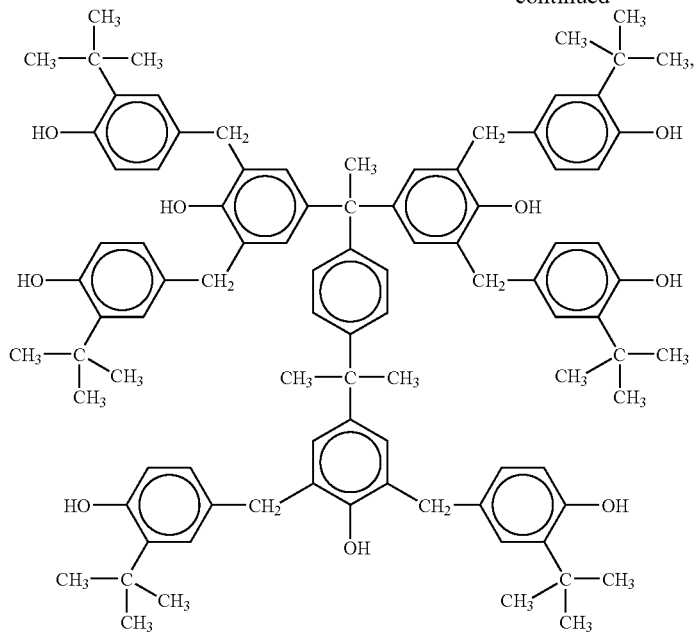
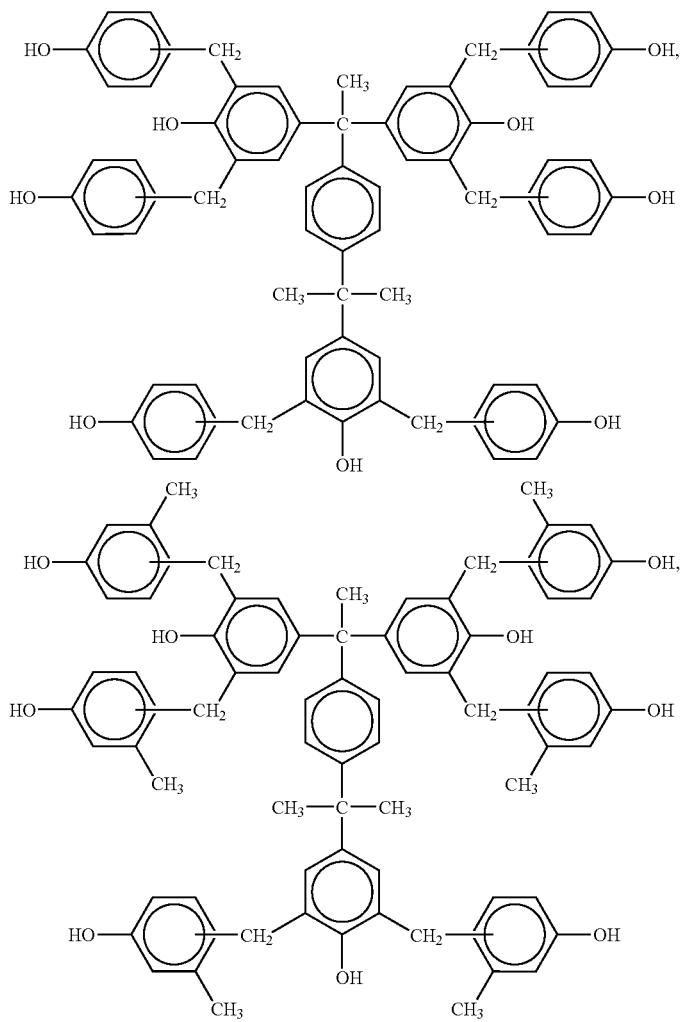

-continued
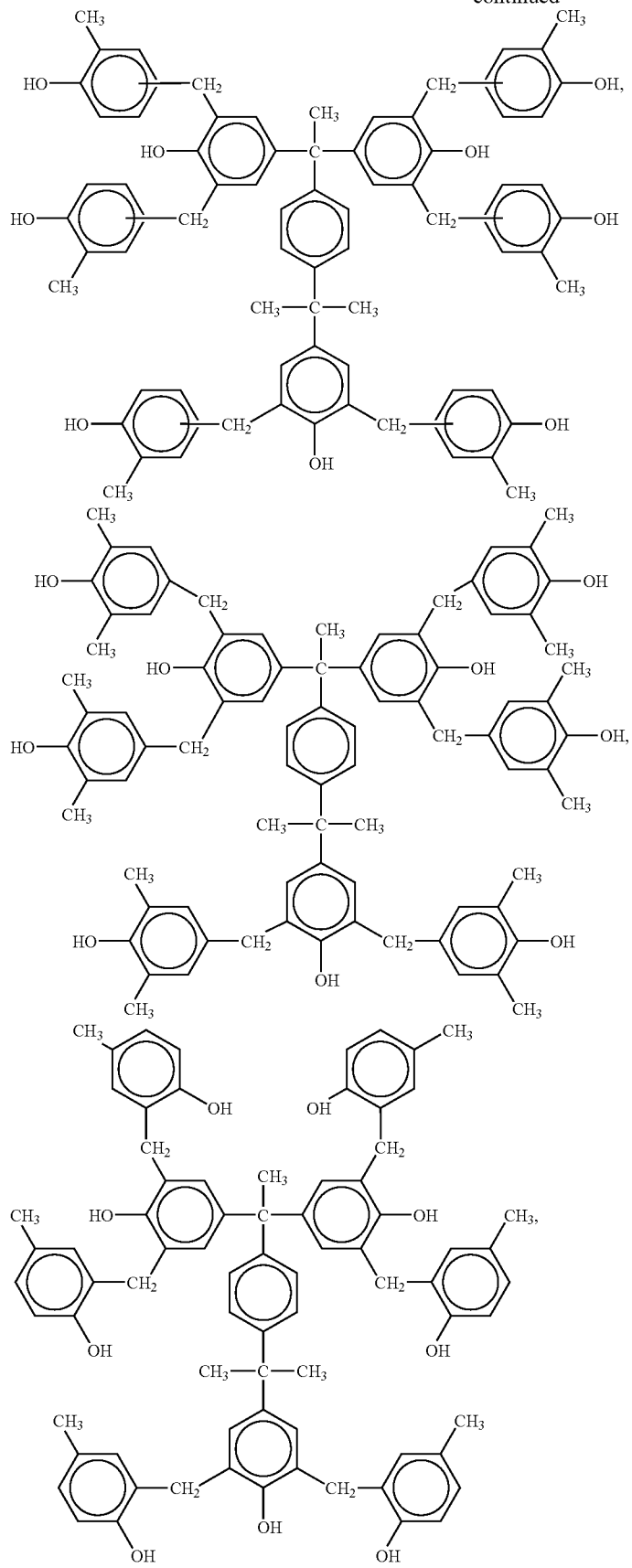

-continued
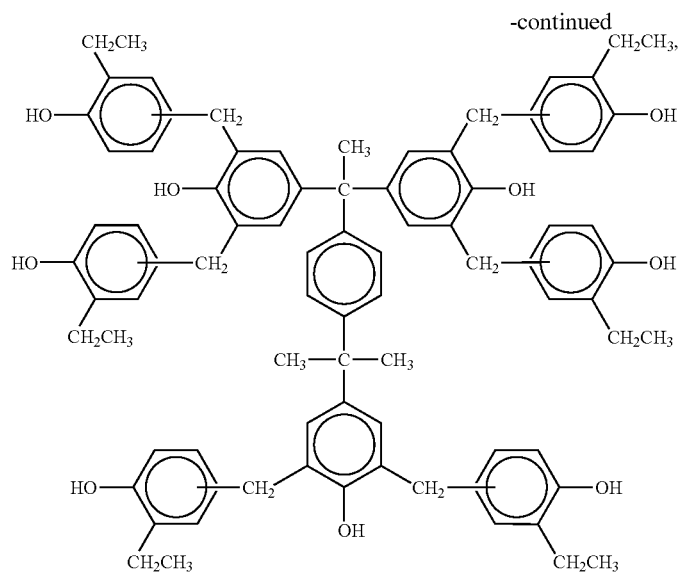
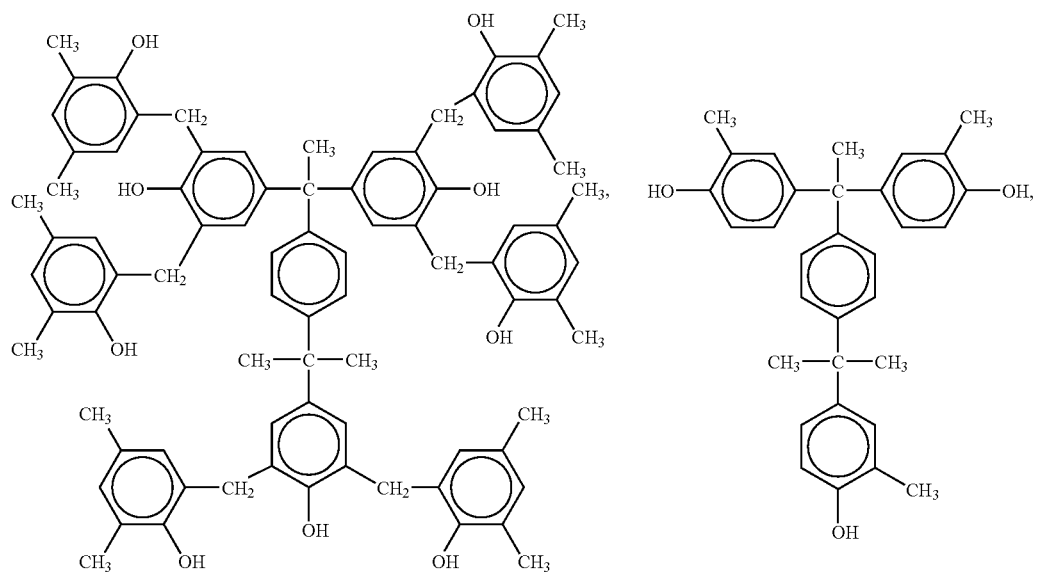
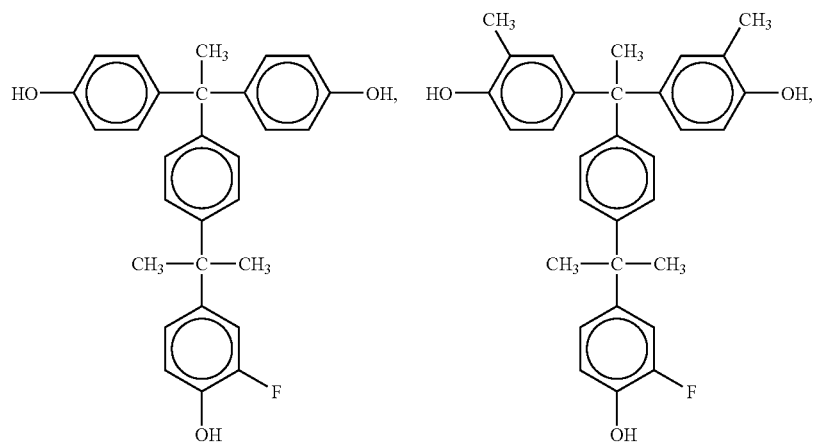

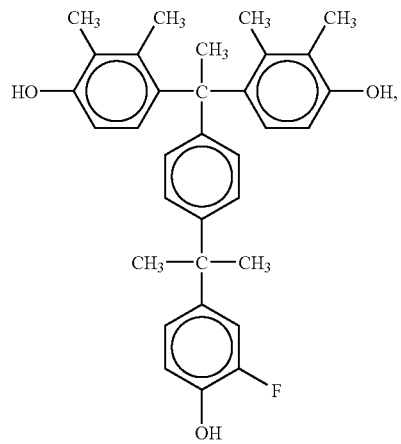
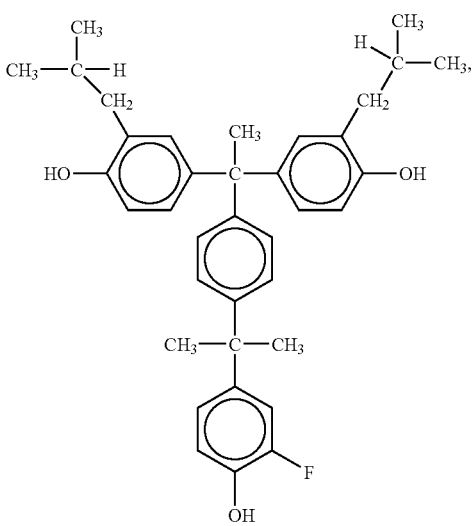

-continued

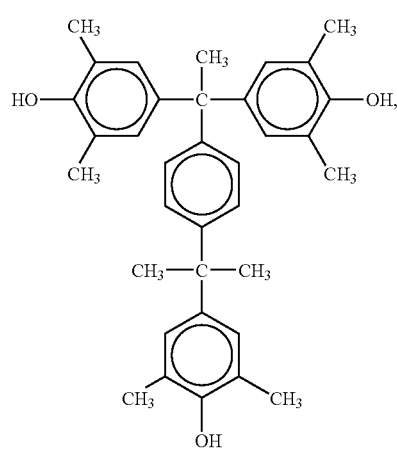
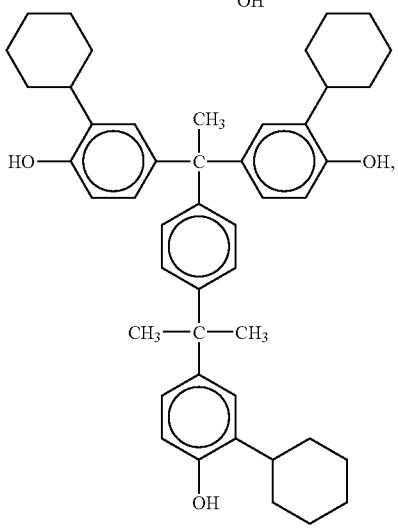

and mixtures thereof.

The light absorber represented by Formula 7 has the excellent absorptivity for a variety of exposure light reflected from the etching layer of a substrate, including the exposure light from ArF (193 nm) excimer laser. Accordingly, the undercutting and notching occurring due to the reflected exposure light can be prevented, and the pattern profile having a uniform thickness can be obtained in a photolithography process. Also, due to the bulky structure of the light absorber, the organic anti-reflective coating layer does not contracted excessively during a curing process. The light absorber also works as a plasticizer, which assists the composition's uniform coating even on a curved or non-uniform substrate. In addition, the light absorber has a good compatibility with a high molecular weight material such as a polymer, and has an excellent solubility to a solvent for forming the organic anti-reflective coating layer, and has a good reactivity with a cross-linking agent. Accordingly, a loss of thickness of the coating layer, which may occur by a photoresist solvent, can be prevented. The light absorber has an excellent absorptivity for an exposure light from a light source such as ArF excimer laser, and thereby the light absorber can be effectively used for a semi-conductor substrate having a high reflectivity. The amount of the light absorber is preferably 0.1 to 30 weight % with respect to the total amount of the composition for forming the organic anti-reflective coating layer. If the amount is less than 0.1 weight %, an undercutting and a notching in a photoresist pattern may occur due to the low absorptivity of light reflected from the substrate of a semi-conductor. If the amount is more than 30 weight %, the coating apparatus can be spoiled due to the occurrence of fumes in a heating process.

As the solvent, which is a component of the composition for forming the organic anti-reflective coating layer according to the prevent invention, a compound which can dissolve the solid components of the composition can be widely used. The preferable solvent has a low toxicity and is capable of forming the uniform organic anti-reflective coating layer. The preferable solvent for the present invention includes butyrolactone, cyclopentanon, cyclohexanon, dimethyl acetamide, dimethyl formamide, dimethyl sulfoxide, N-methyl pyrrolidone, tetrahydro furfural alcohol, propyleneglycol monomethylether(PGME), propyleneglycol monomethylether acetate(PGMEA), ethylactate and the mixtures thereof, and the more preferable solvent includes propyleneglycol monomethylether, propyleneglycol monomethylether acetate(PGMEA), ethylactate and the mixtures thereof. The amount of the solvent is preferably 40 to 99.8 weight % with respect to the total amount of the composition for forming the organic anti-reflective coating layer. If the amount is less than 40 weight %, the thickness of the organic anti-reflective coating layer may become non-uniform. If the amount is more than 99.8 weight %, the physical characteristic of the formed organic anti-reflective coating layer, such as the absorbability of an exposure light, may be deteriorated.

Also, the composition for forming the organic anti-reflective coating layer according to the present invention may further include a cross-linking accelerator such as a cross-linking agent, a low molecular weight alcohol, an acid, or an acid generator, a leveling agent, an adhesion promoter, an anti-foaming agent, and other various additives. As the cross-linking agent for hardening the organic anti-reflective coating layer, a cross-linkable monomer can be preferably used. More preferable cross-linking agent includes a cross-linking agent for cross-linking the polymer having a hydroxyl group, an amide group, a carboxyl group, or a thiol group. The non-limiting examples of the cross-linking agent includes hydroxyl methyl melamine, alkoxylmethyl melamine, urea-formaldehyde resin, benzyl ether, benzyl alcohol, epoxy compound, phenolic resin, isocyanate, block leveling agent, alkylol acryl amide, metacrylamide and the mixtures thereof. Specifically, a phenol based resin (polyvinyl phenol) represented by Formula 8 performs the cross-linking in a baking step of the organic anti-reflective coating layer, and has benzene rings which absorbs the light of a certain wavelength (193 nm). Thus, phenol based resin also prevents a non-uniform reflection of the light. As the cross-linking accelerator for promoting the cross-linking reaction and increasing the reaction efficiency, a thermal acid generator can be preferably used, and the example of the thermal acid generator includes 2-hydroxyhexyl p-toluenesulfonate.

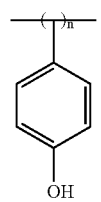

<Formula 8>

In Formula 8, n is a number of the repeating unit and an integer of 2 to 200.

To form the organic anti-reflective coating layer with the composition of the present invention, the composition for forming the organic anti-reflective coating layer is applied on an etching layer, and the applied composition is cured by heating. The step of applying the composition can be carried out by a conventional method such as spin coating, roller coating, and so on. Also, the curing step can be carried out by heating the applied composition with an apparatus such as a high-temperature plate, a convection oven, and so on. The curing process can be preferably carried out at high temperature, so that the cured organic anti-reflective coating layer may not be dissolved in an organic solvent of a photoresist composition or an aqueous alkaline developer. The preferable curing temperature is 70° C. to 250° C. If the curing temperature is less than 70° C., the solvent in the composition cannot be removed sufficiently, and the cross-linking reaction cannot be carried out sufficiently. If the curing temperature is more than 250° C., the composition and the produced organic anti-reflective coating layer might become chemically unstable.

In the cured organic anti-reflective coating layer, the amount of the light absorber is preferably 0.1 to 30 weight %, and the amount of the organic polymer including the repeating unit represented by Formula 2 is preferably 0.1 to 30 weight %. If the amount of the light absorber is less than 0.1 weight %, the absorptivity of the exposure light is not satisfactory, and accordingly an undercutting may occur in a formed photoresist pattern. If the amount of the light absorber is more than 30 weight %, the adhesion property of the organic anti-reflective coating layer is deteriorated, and the organic anti-reflective coating layer may be dissolved by the solvent of a photoresist composition.

The method for forming a semi-conductor circuit pattern by using the composition of the present invention comprises the steps of: applying the composition for forming the organic anti-reflective coating layer on an etching layer; forming the organic anti-reflective coating layer by curing, for example, by heat-curing the composition applied on the etching layer; forming a photoresist pattern by applying a photoresist composition on the organic anti-reflective coating layer to form a photoresist layer, exposing the photoresist layer to an exposure light of a predetermined pattern, and developing the exposed photoresist layer; and forming an etching pattern by etching the organic anti-reflective coating layer and the etching layer by using the formed photoresist pattern as a mask. The process of forming the organic anti-reflective coating layer is described in detail above. The photoresist pattern forming step is a conventional process and can be easily carried out by a skilled person in the art according to the photoresist composition. For example, the photoresist composition is applied or coated on the organic anti-reflective coating layer by a conventional method such as spin-coating, and the photoresist layer can be exposed to an exposure light through a photo-mask of a predetermined pattern. As the light source for radiating the exposure light, KrF excimer laser (248 nm), ArF excimer laser (193 nm), F2 excimer laser (157 nm), electron beam, EUV (Extreme Ultra Violet), VUV (Vacuum Ultra Violet), X-beam, ion beam, and so on can be used. The preferable light source is ArF excimer laser. The composition of the present invention can be used in an emulsion-lithography process. Also, the process of forming the photoresist pattern can optionally include the step of baking the photoresist layer before or after the light exposing process, and the preferable baking temperature is 70° C. to 200° C. If the baking temperature is less than 70° C., the organic solvent in the photoresist composition may not be sufficiently evaporated. If the baking temperature is more than 200° C., the photoresist composition might be pyrolyzed. The developing process can be carried out by using a conventional aqueous developer, and for example, by using 0.01 to 5 weight % TMAH (tetramethyl ammonium hydroxide) aqueous solution. In the next step, the organic anti-reflective coating layer and the etching layer are etched by using the formed photoresist pattern as a mask to form the etching layer pattern. The etching process can be carried out by a conventional dry etching process. The semi-conductor circuit pattern is formed by etching the organic anti-reflective coating layer and the etching layer.

The polymer and the light absorber, which are components of the composition for forming the organic anti-reflective coating layer according to the present invention can be purified with an ion-exchange column, a filter and/or an extracting process before use. By such purification process, the concentration of metal ions or other particles in the polymer and the light absorber can be lowered. Preferably, the concentration of metal ions can be lowered to 50 ppm with respect to the total amount of the composition. The organic anti-reflective coating layer is etched after developing the photoresist layer as described above. Thus, the decrease of the concentration of the metal ion prevents the quality degradation of the semi-conductor after the etching step.

Hereinafter, the preferable examples are provided for better understanding of the present invention. However, the present invention is not limited to the following examples. In Reaction and Formula of Examples 1 to 6, POSS represents <Reaction 1>

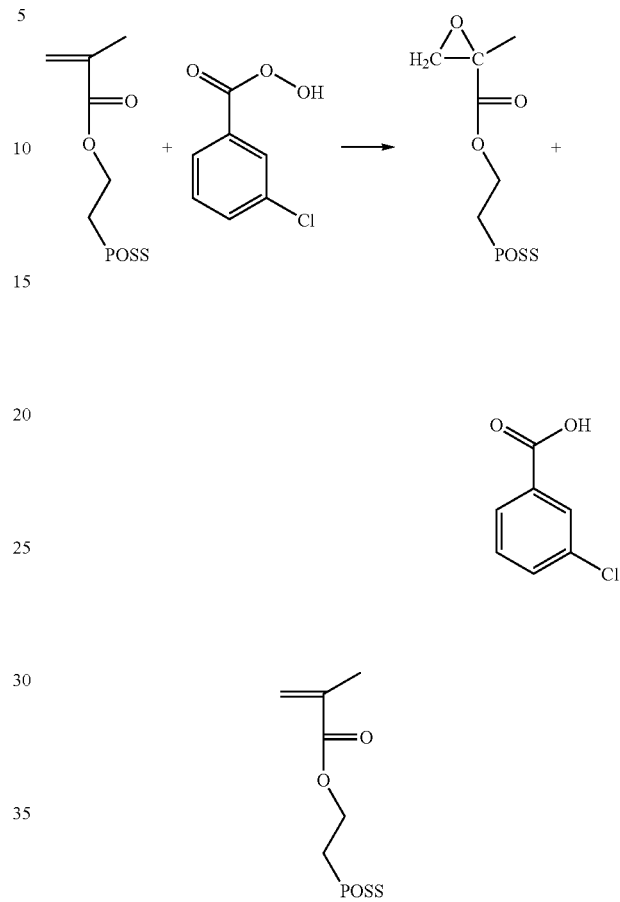

in which x is 8 and R is a methyl group ($CH_3$).

Example 1

Preparation of Methacrylate-POSS Oxide Monomer

A. Preparation of Monomer Represented by Formula 1a

As shown in the following Reaction 1, 30 g (0.033 mol) of monomer represented by Formula 9a and 1 L of chloroform were added into 2 L reactor in which a magnetic stirring rod was provided and the reactor was cooled with iced water. After 10 g (0.058 mol) of 3-chloroperoxybenzoic acid was slowly added to the cooled reactor, the reaction was carried out at room temperature for 24 hours. After the completion of the reaction, the 3-chlorobenzoic acid (by-product) was removed by filtering the product, and then the remaining 3-chlorobenzoic acid was further removed by washing 2 times with saturated sodium sulfite aqueous solution, 1 time with saturated sodium bicarbonate aqueous solution, 1 time with saturated sodium chloride aqueous solution, and 1 time with distilled water. Next, the product was dried with magnesium sulfate, and chloroform was removed under reduced pressure, and then the product was vacuum dried for 1 day to obtain 25 g of monomer represented by Formula 1a with the yield of 80% {$^1$H-NMR ($CDCl_3$): $CH_2$ (2.85), $CH_3$ (2.44), $CH_2$ (4.1)}.

B. Preparation of Monomer Represented by Formula 1b

Except for using 30 g (0.031 mol) of monomer of Formula 9b instead of 30 g of monomer of Formula 9a, the reaction was carried out in the same manner described in A of Example 1 to produce 22.5 g of monomer of Formula 1b with the yield of 75% {$^1$H-NMR ($CDCl_3$): $CH_2$ (2.85), CH (3.91), $CH_2$ (1.68), $CH_2$ (1.4), CH (1.4), $CH_2$ (1.4), $CH_2$ (1.68), $CH_3$ (1.44)}.

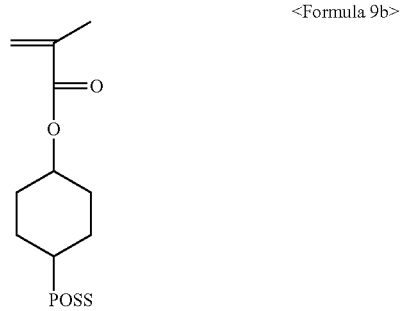

C. Preparation of Monomer Represented by Formula 1c

Except for using 30 g (0.032 mol) of monomer of Formula 9c instead of 30 g of monomer of Formula 9a, the reaction was carried out in the same manner described in A of Example 1 to produce 20.7 g of monomer of Formula 1c with the yield of 69% {$^1$H-NMR (CDCl$_3$): CH$_2$ (2.73), CH$_3$ (1.39), CH (7.1), CH (7.2)}.

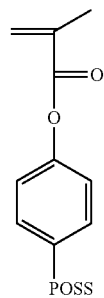

<Formula 9c>

D. Preparation of Monomer Represented by Formula 1d

Except for using 30 g (0.0286 mol) of monomer of Formula 9d instead of 30 g of monomer of Formula 9a, the reaction was carried out in the same manner described in A of Example 1 to produce 22.5 g of monomer of Formula 1d with the yield of 75% {$^1$H-NMR (CDCl$_3$): CH$_2$ (2.85), CH$_3$ (1.44), CH (3.91), CH (1.42), CH (1.4), CH$_2$ (1.68), CH$_2$ (1.40)}.

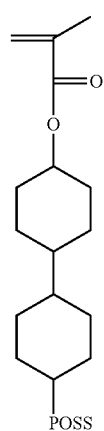

<Formula 9d>

E. Preparation of Monomer Represented by Formula 1e

Except for using 30 g (0.0289 mol) of monomer of Formula 9e instead of 30 g of monomer of Formula 9a, the reaction was carried out in the same manner described in A of Example 1 to produce 19.8 g of monomer of Formula 1e with the yield of 66% {$^1$H-NMR (CDCl$_3$): CH$_2$ (1.73), CH$_3$ (1.39), CH (7.13), CH (7.45), CH (7.3), CH (7.5)}.

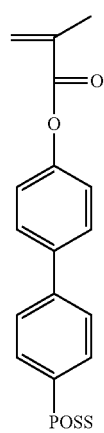

<Formula 9e>

F. Preparation of Monomer Represented by Formula 1f

Except for using 30 g (0.0211 mol) of monomer of Formula 9f instead of 30 g of monomer of Formula 9a, the reaction was carried out in the same manner described in A of Example 1 to produce 21.6 g of monomer of Formula 1f with the yield of 72% {$^1$H-NMR (CDCl$_3$): CH$_2$ (2.85), CH$_3$ (1.44), CH (2.03), CH$_2$ (1.40), CH$_2$ (4.04), CH (1.5)}.

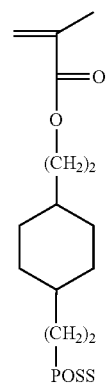

<Formula 9f>

G. Preparation of Monomer of Represented by Formula 1g

Except for using 30 g (0.0213 mol) of monomer of Formula 9g instead of 30 g of monomer of Formula 9a, the reaction was carried out in the same manner described in A of Example 1 to produce 19.5 g of monomer of Formula 1g with the yield of 65% {$^1$H-NMR (CDCl$_3$): CH$_2$ (2.85), CH$_3$ (1.44, CH (7.07), CH (6.99), CH$_2$ (5.34), CH$_2$ (2.6)}.

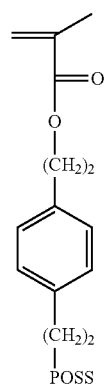

<Formula 9g>

H. Preparation of Monomer Represented by Formula 1h

Except for using 30 g (0.0216 mol) of monomer of Formula 9h instead of 30 g of monomer of Formula 9a, the reaction was carried out in the same manner described in A of Example 1 to produce 21 g of monomer of Formula 1h with the yield of 70% {$^1$H-NMR (CDCl$_3$): CH$_2$ (2.85), CH$_3$ (1.44), CH (2.03), CH$_2$ (1.40), CH (1.42), CH$_2$ (4.04), CH$_2$ (2.6)}.

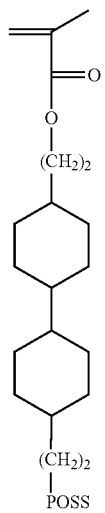

<Formula 9h>

I. Preparation of Monomer Represented by Formula 1 i

Except for using 30 g (0.0221 mol) of monomer of Formula 9i instead of 30 g of monomer of Formula 9a, the reaction was carried out in the same manner described in A of Example 1 to produce 21.9 g of monomer of Formula 1i with the yield of 73% {$^1$H-NMR (CDCl$_3$): CH$_2$ (2.85), CH$_3$ (1.44), CH (7.25), CH (7.41), CH (7.36), CH (7.12), CH$_2$ (2.6), CH$_2$ (5.34)}.

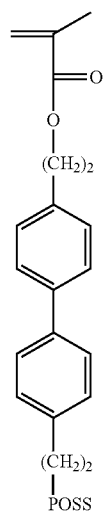

<Formula 9i>

Example 2

Preparation of Methacrylate-POSS Oxide Polymer

A. Preparation of polymer represented by Formula 2a

As shown in the following Reaction 2, 15 g of monomer of Formula 1a prepared in A of Example 1 was added into 500 mL reactor in which a magnetic stirring rod was provided, and dissolved with 300 mL of dichloromethane. The reaction solution was cooled with iced water. Next, 3 mL of borontrifluoride diethylether, which is a polymerization catalyst, was very slowly and dropwisely added to the solution with a syringe. After increasing temperature of the reaction solution to room temperature, the reaction was carried out under nitrogen atmosphere for 4 days. After completion of the reaction, the reaction product was precipitated by being poured into 3 L water, and the pure solid reaction product was obtained. The obtained product was filtered and dried to obtain 12 g of the polymer represented by Formula 2a (m=10, Mw=9,570).

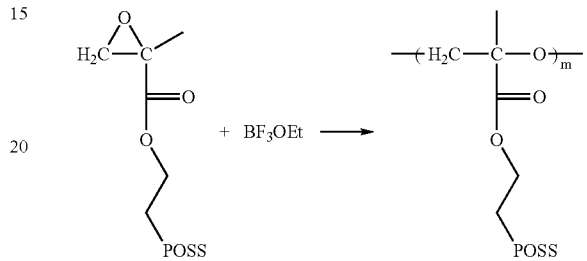

<Reaction 2>

B. Preparation of Polymer Represented by Formula 2b

Except for using 15 g of monomer of Formula 1b prepared in B of Example 1 instead of 15 g of monomer of Formula 1a, the reaction was carried out in the same manner described in A of Example 2 to produce 10 g of polymer of Formula 2b (m=12, Mw=12,500).

C. Preparation of Polymer Represented by Formula 2c

Except for using 15 g of monomer of Formula 1c prepared in C of Example 1 instead of 15 g of monomer of Formula 1a, the reaction was carried out in the same manner described in A of Example 2 to produce 8 g of polymer of Formula 2c (m=13, Mw=14,000).

D. Preparation of Polymer Represented by Formula 2d

Except for using 15 g of monomer of Formula 1d prepared in D of Example 1 instead of 15 g of monomer of Formula 1a, the reaction was carried out in the same manner described in A of Example 2 to produce 10 g of polymer of Formula 2d (m=10, Mw=11,000).

E. Preparation of Polymer Represented by Formula 2e

Except for using 15 g of monomer of Formula 1e prepared in E of Example 1 instead of 15 g of monomer of Formula 1a, the reaction was carried out in the same manner described in A of Example 2 to produce 9 g of polymer of Formula 2e (m=11, Mw=12,000).

F. Preparation of Polymer Represented by Formula 2f

Except for using 15 g of monomer of Formula 1f prepared in F of Example 1 instead of 15 g of monomer of Formula 1a, the reaction was carried out in the same manner described in A of Example 2 to produce 8 g of polymer of Formula 2f (m=13, Mw=14,500).

G. Preparation of Polymer Represented by Formula 2g

Except for using 15 g of monomer of Formula 1g prepared in G of Example 1 instead of 15 g of monomer of Formula 1a, the reaction was carried out in the same manner described in A of Example 2 to produce 10 g of polymer of Formula 2 g (m=15, Mw=16,000).

H. Preparation of Polymer Represented by Formula 2h

Except for using 15 g of monomer of Formula 1h prepared in H of Example 1 instead of 15 g of monomer of Formula 1a, the reaction was carried out in the same manner described in A of Example 2 to produce 10 g of polymer of Formula 2h (m=13, Mw=15,000).

I. Preparation of Polymer Represented by Formula 2i

Except for using 15 g of monomer of Formula 1i prepared in I of Example 1 instead of 15 g of monomer of Formula 1a, the reaction was carried out in the same manner described in A of Example 2 to produce 9 g of polymer of Formula 2i (m=14, Mw=16,500).

Example 3

Preparation of Copolymer

A~E. Preparation of Copolymers Represented by Formula 3

Two compounds shown in the following Table 1 were added into 1 L reactor in which a magnetic stirring rod was provided, and dissolved with 500 mL of dichloromethane. The reaction solution was cooled with iced water. Next, 3 mL of borontrifluoride diethylether, which is a polymerization catalyst, was very slowly and dropwisely added to the solution with a syringe. After increasing temperature of the reaction solution to room temperature, the reaction was carried out under nitrogen atmosphere for 4 days. After completion of the reaction, the reaction product was precipitated by being poured into 3 L water, and the pure solid reaction product was obtained. The obtained product was filtered and dried to obtain copolymer of Formula 3. The amounts of repeating units (mol %), weight-average molecular weight (Mw), polydispersity (PDI) and yield(%) of the produced copolymer are set forth in the following Table 1.

TABLE 1

| Example 3 | Compound | Amount used | compound | Amount used | Repeating unit (a:b) mol % | Mw | PDI | Yield (%) |
|---|---|---|---|---|---|---|---|---|
| A | Formula 1a (0.0054 mol) | 5 g | Formula 5a (0.034 mol) | 5 g | 15:85 | 10,200 | 1.89 | 78 |
| B | Formula 1c (0.0051 mol) | | Formula 5a (0.034 mol) | | 12:88 | 9,800 | 1.92 | 65 |
| C | Formula 1e (0.0047 mol) | | Formula 5b (0.031 mol) | | 18:82 | 10,900 | 1.85 | 50 |
| D | Formula 1g (0.0036 mol) | | Formula 5b (0.031 mol) | | 15:85 | 8,500 | 1.95 | 66 |
| E | Formula 1i (0.0035 mol) | | Formula 5c (0.035 mol) | | 13:87 | 9,300 | 1.90 | 72 |

Example 4

Preparation of Terpolymer

A~O. Preparation of Terpolymer Represented by Formula 4

Three compounds shown in the following Table 2 were injected into 1 L reactor in which a magnetic stirring rod was provided, and dissolved with 500 mL of dichloromethane. The reaction solution was cooled with iced water. Next, 3 mL of borontrifluoride diethylether, which is a polymerization catalyst, was very slowly and dropwisely added to the solution with a syringe. After increasing temperature of the reaction solution to room temperature, the reaction was carried out under nitrogen atmosphere for 4 days. After completion of the reaction, the reaction product was precipitated by being poured into 3 L water, and the pure solid reaction product was obtained. The obtained product was filtered and dried to obtain terpolymer of Formula 4. The amounts of repeating units (mol %), weight-average molecular weight (Mw), polydispersity (PDI) and yield(%) of the produced terpolymer are set forth in the following Table 2.

TABLE 2

| Example 4 | Compound | Amount used | Compound | Amount used | Compound | Amount used | Repeating unit (a:b:c) mol % | Mw | PDI | Yield (%) |
|---|---|---|---|---|---|---|---|---|---|---|
| A | 1a | 5 g (0.0054 mol) | 5a | 2 g (0.0137 mol) | 6a | 2 g (0.0137 mol) | 20:40:40 | 12,000 | 1.78 | 80 |
| B | 1b | 5 g (0.0051 mol) | 5b | 2 g (0.0125 mol) | 6b | 2 g (0.0126 mol) | 15:40:45 | 11,500 | 1.82 | 75 |
| C | 1c | 5 g (0.0051 mol) | 5c | 2 g (0.0138 mol) | 6c | 2 g (0.0138 mol) | 18:40:42 | 10,200 | 1.68 | 69 |
| D | 1d | 5 g (0.0047 mol) | 5a | 2 g (0.0137 mol) | 6a | 2 g (0.0137 mol) | 12:52:36 | 9,800 | 1.77 | 75 |
| E | 1e | 5 g (0.0047 mol) | 5b | 2 g (0.0125 mol) | 6b | 2 g (0.0126 mol) | 15:52:33 | 9,600 | 1.86 | 66 |
| F | 1f | 5 g (0.00364 mol) | 5c | 2 g (0.0138 mol) | 6c | 2 g (0.0138 mol) | 11:44:45 | 10,500 | 1.86 | 72 |
| G | 1g | 5 g (0.00359 mol) | 5a | 2 g (0.0137 mol) | 6a | 2 g (0.0137 mol) | 12:45:43 | 11,200 | 1.69 | 65 |
| H | 1h | 5 g (0.00356 mol) | 5b | 2 g (0.0125 mol) | 6b | 2 g (0.0126 mol) | 10:45:45 | 10,900 | 1.73 | 70 |
| I | 1i | 5 g (0.00348 mol) | 5c | 2 g (0.0138 mol) | 6c | 2 g (0.0138 mol) | 15:35:50 | 9,900 | 1.85 | 73 |
| J | 1c | 5 g (0.0051 mol) | 5a | 2 g (0.0137 mol) | 6a | 2 g (0.0137 mol) | 11:39:50 | 12,500 | 1.88 | 71 |
| K | 1e | 5 g (0.0047 mol) | 5b | 2 g (0.0125 mol) | 6e | 2 g (0.0129 mol) | 12:44:44 | 11,200 | 1.77 | 73 |
| L | 1g | 5 g (0.00359 mol) | 5a | 2 g (0.0137 mol) | 6a | 2 g (0.0137 mol) | 13:39:48 | 9,550 | 1.82 | 80 |
| M | 1i | 5 g (0.00348 mol) | 5c | 2 g (0.0138 mol) | 6e | 2 g (0.0129 mol) | 10:43:47 | 9,860 | 1.79 | 69 |
| N | 1e | 5 g (0.0047 mol) | 5c | 2 g (0.0138 mol) | 6f | 2 g (0.0139 mol) | 12:50:38 | 11,800 | 1.82 | 75 |
| O | 1a | 5 g (0.0054 mol) | 5b | 2 g (0.0125 mol) | 6b | 2 g (0.0126 mol) | 15:49:36 | 12,100 | 1.80 | 79 |

Example 5

Preparation of Composition for Forming an Organic Anti-Reflective Coating Layer A~O. Preparation of Composition for Forming an Organic Anti-Reflective Coating Layer Containing Terpolymer of Formula 4

A composition for forming BARC layer was produced by mixing 0.13 g of terpolymer produced in A~O of Example 4, 0.091 g of a light absorber of Formula 10, 0.06 g of polyvinyl phenol (cross-linking agent), 0.01 g of 2-hydroxyhexyl p-toluenesulfonate (acid generator) and 13.67 g of propyleneglycol monomethylether acetate (PGMEA).

<Formula 10>

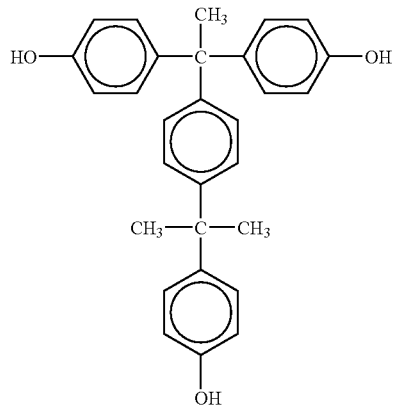

Example 6

Formation and Evaluation of Organic Anti-Reflective Coating Layer

The composition for forming an organic anti-reflective coating layer prepared in A~O of Example 5 was uniformly applied on a silicon substrate with a thickness of 350 Å, and was cured at 205° C. for 90 seconds to form an organic anti-reflective coating layer. A mixture of 33.3 weight % of 2-heptanone, 33.3 weight % of ethylactate (EL), and 33.4 weight % of PGMEA, which is a solvent for a photoresist composition, was sufficiently sprayed on the produced organic anti-reflective coating layer. Then, the layer was kept for 1 minute, and was dried by spinning the substrate for 30 seconds with the spinning speed of 5000 rpm, and was heated on a heating-plate at 100° C. for 60 seconds. After the treatment of the photoresist solvent, the loss of thickness of the organic anti-reflective coating layer was 0%. Refractive index (n) and absorptivity(k) of the produced organic anti-reflective coating layer was also measured at the wavelength of 193 nm and are set forth in Table 3.

TABLE 3

| Composition for forming BARC layer | n | k | Film Loss(%) |
|---|---|---|---|
| A of Example 5 | 1.68 | 0.43 | 0% |
| B of Example 5 | 1.65 | 0.56 | 0% |
| C of Example 5 | 1.59 | 0.50 | 0% |
| D of Example 5 | 1.62 | 0.48 | 0% |
| E of Example 5 | 1.66 | 0.52 | 0% |
| F of Example 5 | 1.69 | 0.43 | 0% |
| G of Example 5 | 1.68 | 0.43 | 0% |
| H of Example 5 | 1.65 | 0.52 | 0% |
| I of Example 5 | 1.65 | 0.45 | 0% |
| J of Example 5 | 1.56 | 0.39 | 0% |
| K of Example 5 | 1.68 | 0.40 | 0% |
| L of Example 5 | 1.70 | 0.42 | 0% |
| M of Example 5 | 1.66 | 0.49 | 0% |
| N of Example 5 | 1.60 | 0.40 | 0% |
| O of Example 5 | 1.62 | 0.50 | 0% | n: real part (refractive index at 193 nm)
k: imaginary part (absorptivity at 193 nm)

From Table 3, the composition for forming BARC layer according to the present invention has superior refractive index (n) and absorptivity (k) at the wavelength of 193 nm. In general, when k is less than a certain value at a given wavelength (for example, k<0.3), the absorptivity decreases, and the undercutting and the notching, etc can be generated due to the non-uniform reflection. Thus, the photoresist pattern profile is deteriorated. On the contrary, when k is more than a certain value (for example, k>0.7), the absorptivity excessively increases, and the sensitivity of photoresist may be deteriorated. Thus, the throughput of the semiconductor production can be deteriorated. As n increases (for example, n>1.8), the thickness of the organic anti-reflective coating layer can be reduced. On the contrary, as n decreases (for example, n<1.4), the thickness of the organic anti-reflective coating layer should be thickened and there is a problem that the etch rate becomes very slow.

The polymer for forming an organic anti-reflective coating layer according to the present invention has a high absorptivity for an exposure light. Thus, the generation of the standing wave, the undercutting and the notching can be prevented and the uniform photoresist pattern profile can be obtained. In addition, the polymer easily forms the organic anti-reflective coating layer, has an improved etch rate and adhesion property to a substrate. In the photolithography process using various exposure lights, including ArF (193 nm) excimer laser, the composition for forming an organic anti-reflective coating layer prevents the adverse effects which results from the non-uniformly reflected exposure light.

The invention claimed is:

1. A monomer for forming an organic anti-reflective coating layer represented by Formula 1, <Formula 1>

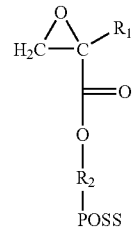

wherein, $R_1$ is a hydrogen atom, a methyl group or an ethyl group, $R_2$ is a $C_1$~$C_{20}$ alkylene group, a $C_3$~$C_{20}$ cycloalkylene group or a $C_5$~$C_{20}$ aromatic hydrocarbon group, and POSS is a polyhedral-oligomeric-silsesquioxane.

2. The monomer for forming an organic anti-reflective coating layer of claim 1, wherein $R_2$ is selected from the group consisting of

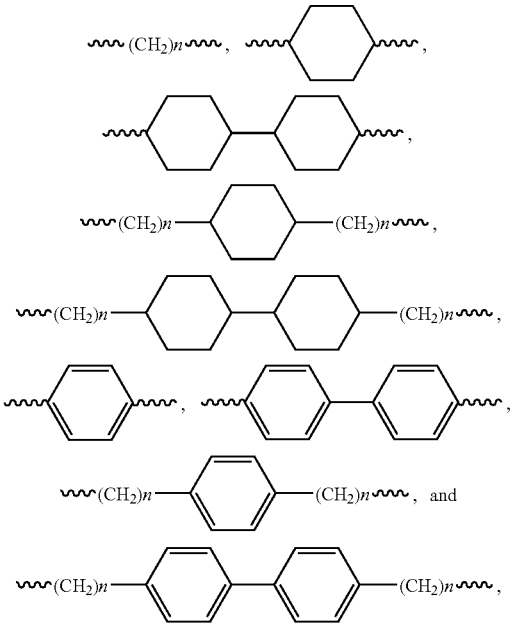

wherein, the symbol ⌇ indicates a connecting bond, n is an integer which satisfies the total number of carbon atoms of the alkylene group, the cycloalkylene group or the aromatic hydrocarbon group, and the POSS is

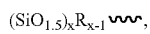

wherein x is
wherein x is 8, 10 or 12, and R is H, OH, or a $C_1$~$C_{20}$ alkyl group, alkene group, alkyne group, aryl group or alkoxyl group.

3. A polymer for forming an organic anti-reflective coating layer including a repeating unit represented by Formula 2, <Formula 2>

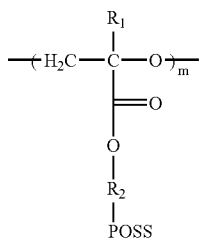

wherein, $R_1$ is a hydrogen atom, a methyl group or an ethyl group, $R_2$ is a $C_1$~$C_{20}$ alkylene group, a $C_3$~$C_{20}$ cycloalkylene group or a $C_6$~$C_{20}$ aromatic hydrocarbon group, POSS is a polyhedral-oligomeric-silsesquioxane, and m is an integer of 2 to 110.

4. The polymer for forming an organic anti-reflective coating layer of claim 3, wherein the polymer is selected from the group consisting of <Formula 2a>

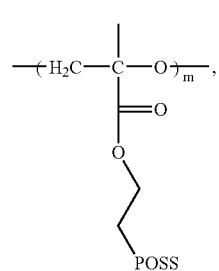

<Formula 2b>

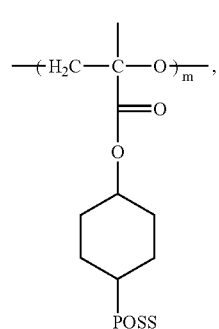

<Formula 2c>

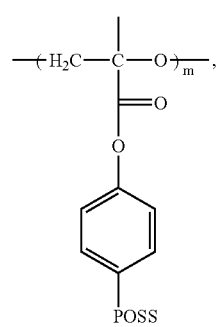

<Formula 2d>

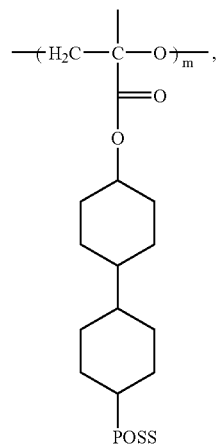

-continued

<Formula 2e>

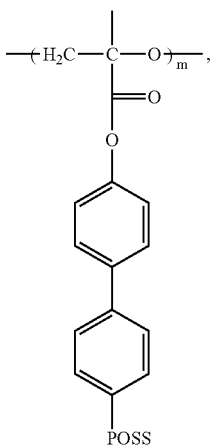

<Formula 2f>

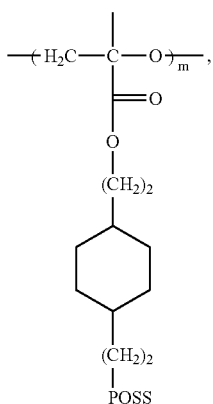

<Formula 2g>

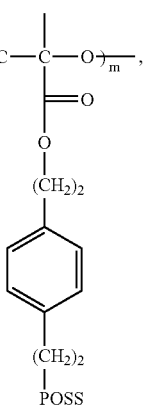

-continued

<Formula 2h>

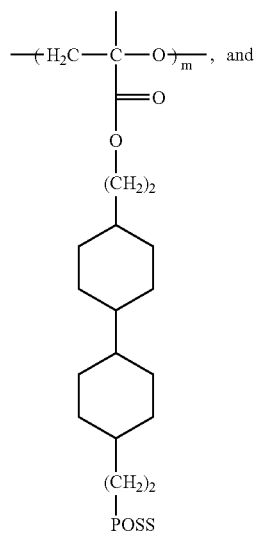

, and

<Formula 2i>

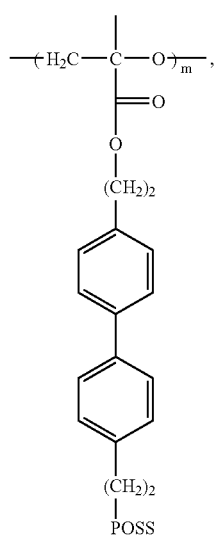

wherein m is an integer of 2 to 110.

5. The polymer for forming an organic anti-reflective coating layer of claim 3, wherein the polymer is represented by Formula 3 or Formula 4, <Formula 3>

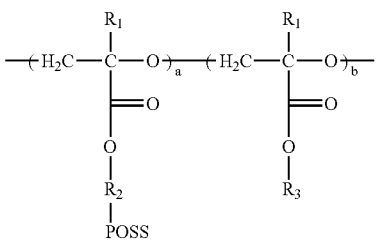

wherein, $R_1$, $R_2$ and POSS are as defined in Formula 2, $R_3$ is a $C_2$~$C_{20}$ hydroxy hydrocarbon group (R—OH) or a $C_2$~$C_{20}$ alkyl oxirane group, and a and b represent mol % of the respective repeating unit with respective to the total repeating units constituting the polymer, and are 1~90 mol % and 1~90 mol %, respectively,

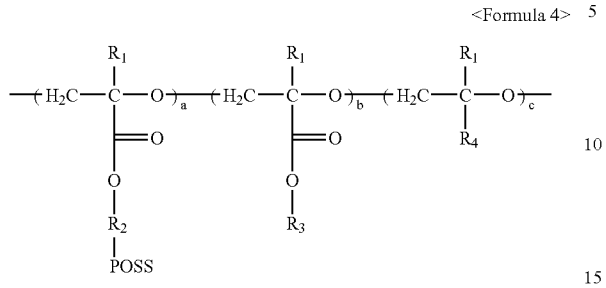
<Formula 4> wherein, $R_1$, $R_2$, POSS and $R_3$ are as defined in Formula 3, $R_4$ is a substituted ammonia group, a N-substituted heterocyclic compound group or a N and O-substituted heterocyclic compound group, and a, b and c represent mol % of the respective repeating unit with respect to the total repeating units constituting the polymer, and are 1~90 mol %, 1~90 mol % and 1~90 mol %, respectively.

6. A composition for forming an organic anti-reflective coating layer, comprising an organic polymer containing a repeating unit represented by Formula 2, a light absorber and a solvent,

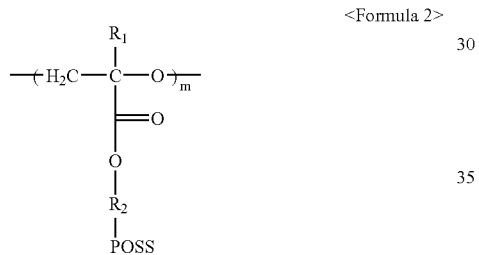
<Formula 2> wherein, $R_1$ is a hydrogen atom, a methyl group or an ethyl group, $R_2$ is a $C_1$~$C_{20}$ alkylene group, a $C_3$~$C_{20}$ cycloalkylene group or a $C_6$~$C_{20}$ aromatic hydrocarbon group, POSS is a polyhedral-oligomeric-silsesquioxane, and m is an integer of 2 to 110.

7. The composition for forming an organic anti-reflective coating layer of claim 6, wherein the light absorber is a compound represented by Formula 7,

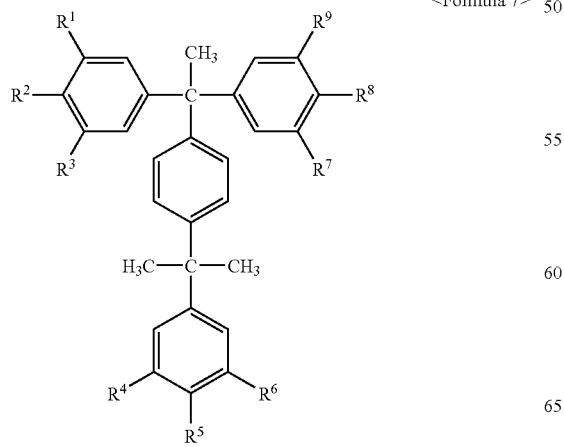
<Formula 7> wherein, $R^1$ to $R^9$ are independently a hydrogen atom, a hydroxy group, a halogen atom, a nitro group, an amino group, a $C_1$~$C_8$ alkyl group with or without a hydroxy group, a $C_1$~$C_8$ alkoxy group with or without a carbonyl group, a phenyl group, a $C_5$~$C_{10}$ cycloalkyl group, a $C_5$~$C_{10}$ aryl-alkyl group, or a $C_5$~$C_{10}$ alkyl-aryl group, and at least one of $R^1$ to $R^9$ is not a hydrogen atom.

8. The composition for forming an organic anti-reflective coating layer of claim 6, wherein the solvent is selected from the group consisting of butyrolactone, cyclopentanon, cyclohexanon, dimethyl acetamide, dimethyl formamide, dimethyl sulfoxide, N-methyl pyrrolidone, tetrahydro furfural alcohol, propyleneglycol monomethylether(PGME), propyleneglycol monomethylether acetate(PGMEA), ethyllactate and the mixtures thereof.

9. The composition for forming an organic anti-reflective coating layer of claim 6, wherein the amount of the organic polymer is 0.1 to 30 weight %, the amount of the light absorber is 0.1 to 30 weight %, and the amount of solvent is 40 to 99.8 weight % with respect to total amount of the composition for forming an organic anti-reflective coating layer.

10. A method for forming a semi-conductor circuit pattern, comprising the steps of:

applying a composition comprising an organic polymer containing a repeating unit represented by Formula 2, a light absorber and a solvent, on an etching layer;

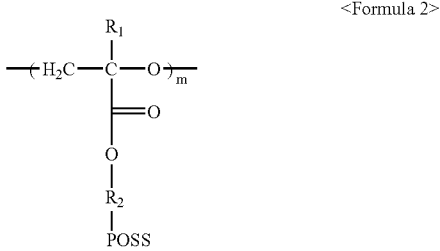
<Formula 2> wherein, $R_1$ is a hydrogen atom, a methyl group or an ethyl group, $R_2$ is a $C_1$~$C_{20}$ alkylene group, a $C_3$~$C_{20}$ cycloalkylene group or a $C_6$~$C_{20}$ aromatic hydrocarbon group, POSS is a polyhedral-oligomeric-silsesquioxane, and m is an integer of 2 to 110, forming an organic anti-reflective coating layer by curing the composition applied on the etching layer;

forming a photoresist pattern by applying a photoresist composition on the organic anti-reflective coating layer to form a photoresist layer, exposing the photoresist layer to an exposure light of a predetermined pattern, and developing the exposed photoresist layer; and forming an etching pattern by etching the organic anti-reflective coating layer and the etching layer by using the formed photoresist pattern as a mask.

* * * * *